(12) United States Patent
Adams et al.

(10) Patent No.: US 8,451,668 B1
(45) Date of Patent: May 28, 2013

(54) IMPLEMENTING COLUMN REDUNDANCY STEERING FOR MEMORIES WITH WORDLINE REPOWERING

(75) Inventors: Chad A. Adams, Byron, MN (US); Travis R. Hebig, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/309,068

(22) Filed: Dec. 1, 2011

(51) Int. Cl.
*G11C 7/00* (2006.01)
*G11C 7/10* (2006.01)

(52) U.S. Cl.
USPC .................................. 365/189.02; 365/230.02

(58) Field of Classification Search
None
See application file for complete search history.

(56) References Cited

U.S. PATENT DOCUMENTS

| | | | |
|---|---|---|---|
| 5,295,101 A | 3/1994 | Stephens, Jr. et al. | |
| 5,870,341 A | 2/1999 | Lin et al. | |
| 6,366,508 B1 * | 4/2002 | Agrawal et al. | 365/200 |
| 6,373,783 B1 * | 4/2002 | Tomita | 365/233.1 |
| 6,728,159 B2 | 4/2004 | Anand et al. | |
| 7,064,990 B1 * | 6/2006 | Dawson et al. | 365/200 |
| 7,075,855 B1 | 7/2006 | Bunce et al. | |
| 7,117,400 B2 | 10/2006 | Batson et al. | |
| 7,443,744 B2 | 10/2008 | Behrends et al. | |
| 7,609,569 B2 | 10/2009 | Fragano et al. | |
| 2010/0220527 A1 | 9/2010 | Norman | |
| 2010/0259965 A1 | 10/2010 | Kurjanowicz et al. | |
| 2011/0164463 A1 | 7/2011 | Pilo et al. | |

* cited by examiner

*Primary Examiner* — Hoai V Ho
*Assistant Examiner* — Thang Hoang
(74) *Attorney, Agent, or Firm* — Joan Pennington

(57) ABSTRACT

A method and circuit for implementing column redundancy steering for memories with wordline repowering, and a design structure on which the subject circuit resides are provided. Each respective data column receives a precharge signal applied to an associated precharge function. An inverting multiplexer is provided in a precharge path after the wordline repowering having inputs coupled to the respective precharge functions before and after the wordline repowering. The inverting multiplexer passes the precharge signal from the precharge function before the wordline repowering or from the precharge function after the wordline repowering. The inverting multiplexer is controlled by the redundancy steering control signal that activates redundancy steering.

20 Claims, 4 Drawing Sheets

IMPLEMENTING COLUMN REDUNDANCY STEERING FOR MEMORIES WITH WORDLINE REPOWERING

FIELD OF THE INVENTION

The present invention relates generally to the data processing field, and more particularly, relates to a method and circuit for implementing column redundancy steering for memories with wordline repowering, and a design structure on which the subject circuit resides.

DESCRIPTION OF THE RELATED ART

As technology nodes progress, wires become more resistive. The higher resistance is problematic in memories, such as Static Random Access Memories (SRAMs) with long wordlines. One solution is to provide repowering buffers within long wordlines. However, this solution is problematic because difficult timing considerations can result. For example in domino read SRAMs with column redundancy, difficult timing considerations can result in the bit column switching before or after wordline repowering buffers.

The problem is that the data input to the dynamic merged redundancy steering and bit multiplexer circuit in the read path can be generated from a bit column before the wordline repowering and the precharge signal to this dynamic merged redundancy steering and bit multiplexer circuit comes from after the wordline repowering. The state of the redundancy steering determines which bit column of data is received by the dynamic merged redundancy steering and bit multiplexer circuit. However, the precharge signal going to the same dynamic merged redundancy steering and bit multiplexer circuit is fixed and is not steered. Therefore, it is difficult to design appropriate timing margins in the dynamic merged redundancy steering and bit multiplexer circuit because the data can be shifted by an amount equal to the delay through the wordline repowering buffers.

A need exists for a circuit having an efficient and effective mechanism for implementing column redundancy steering for memories with wordline repowering.

SUMMARY OF THE INVENTION

Principal aspects of the present invention are to provide a method and circuit for implementing column redundancy steering for memories with wordline repowering, and a design structure on which the subject circuit resides. Other important aspects of the present invention are to provide such method, circuit and design structure substantially without negative effects and that overcome many of the disadvantages of prior art arrangements.

In brief, a method and circuit for implementing column redundancy steering for memories with wordline repowering, and a design structure on which the subject circuit resides are provided. Each respective data column receives a precharge signal applied to an associated precharge function. An inverting multiplexer is provided in a precharge path after the wordline repowering having inputs coupled to the respective precharge functions before and after the wordline repowering. The inverting multiplexer passes the precharge signal from the precharge function before the wordline repowering or from the precharge function after the wordline repowering. The inverting multiplexer is controlled by the redundancy steering control signal that activates redundancy steering.

In accordance with features of the invention, the circuit includes a dynamic merged redundancy steering and bit multiplexer circuit that selects a data signal from a previous data column responsive to the redundancy steering control signal being enabled. The redundancy steering and bit multiplexer circuit blocks a data signal from the previous data column responsive to the redundancy steering control signal not being enabled; and passes a data signal from an input data column.

In accordance with features of the invention, the precharge signal is applied to a data signal net at an output of a dynamic merged redundancy steering and bit multiplexer circuit.

In accordance with features of the invention, precharge and data signal pairs are provided either before or after the repowering buffers repowering the wordline.

In accordance with features of the invention, the inverting multiplexer provides precharge signal steering with the data steering after the repowering buffers repowering the wordline.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing enhanced column redundancy steering for memories with wordline repowering, and a design structure on which the subject circuit resides are provided.

Figure 1:
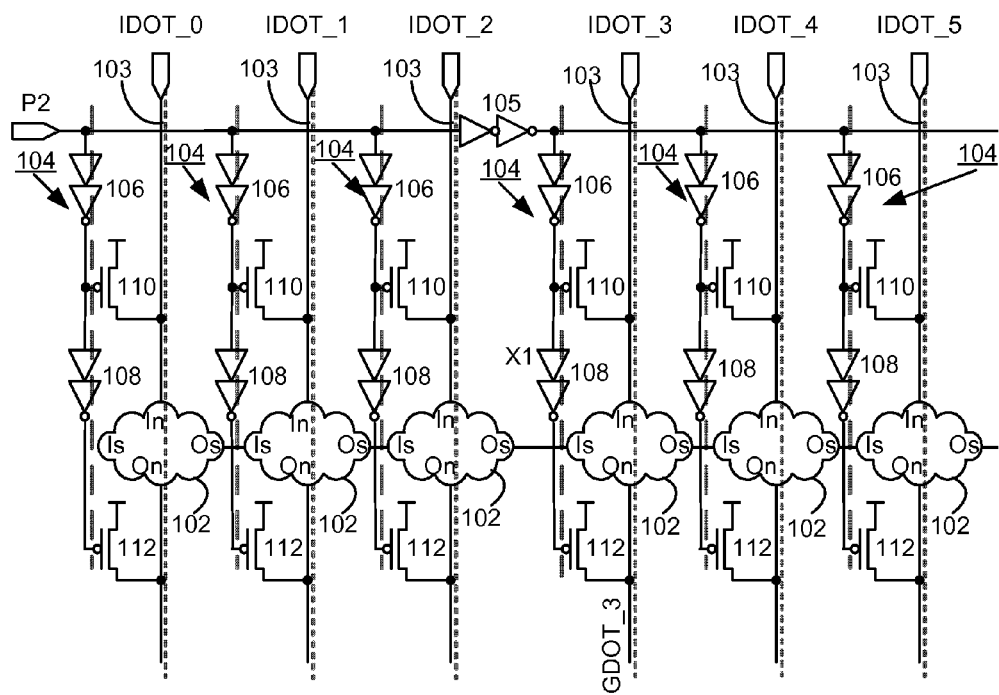
FIGS. 1 and 2 illustrate a prior art SRAM column redundancy steering circuit.
Figure 2:
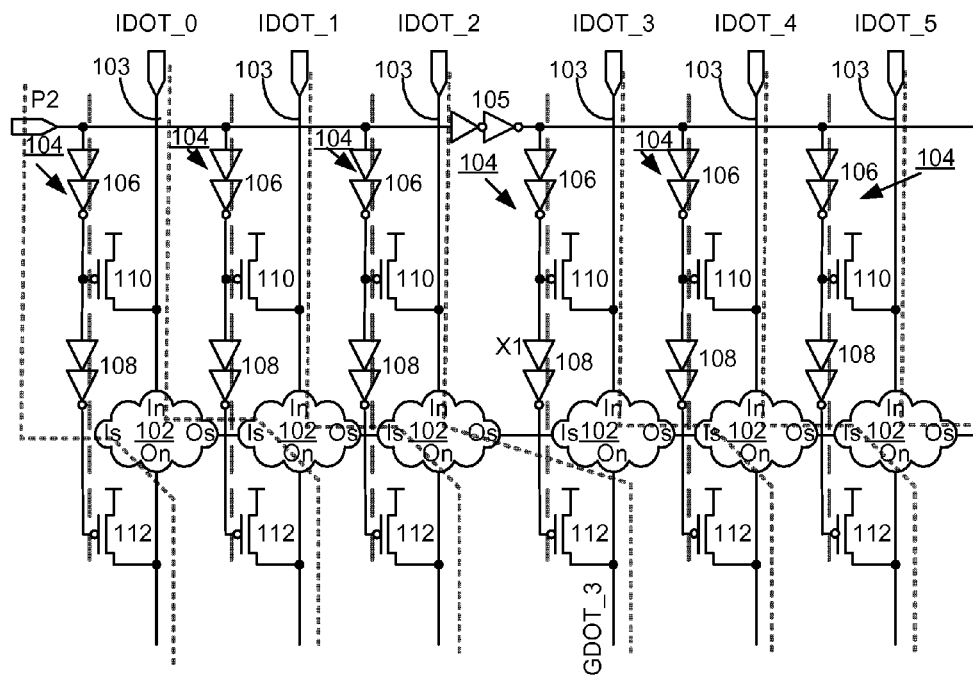

Referring first to FIGS. 1 and 2, there is shown a prior art SRAM column redundancy steering circuit. A dynamic merged redundancy steering and bit multiplexer circuit 102 is represented by a cloud. A plurality of data signals IDOT_0, IDOT_1, IDOT_2, IDOT_3, IDOT_4, and IDOT_5 from an SRAM core is coupled by a respective data column 103 to the respective dynamic merged redundancy steering and bit multiplexer circuits 102.

As shown in FIGS. 1 and 2, the illustrated prior art SRAM column redundancy steering circuit includes a plurality of respective precharge functions generally designated by the reference character 104 and repowering buffers 105. Each respective precharge function 104 is provided with an associated respective data column 103.

A signal initiating the precharge of this data is P2 shown as an input on the left to the respective precharge functions 104. Precharge input signal P2 is repowered at the same point of the SRAM core width as the wordlines.

Each respective precharge function 104 includes a first precharge buffer 106 and a second precharge buffer 108, respectively providing a gate input to a respective P-channel field effect transistor (PFET) 110, 112. Each respective P-channel field effect transistor (PFET) 110, 112 of the respective precharge functions 104 is connected between a supply voltage V and the respective adjacent SRAM data column 103 before and after the dynamic merged redundancy steering and bit multiplexer circuit 102 respectively applying a precharge signal to data column 103.

Each dynamic merged redundancy steering and bit multiplexer circuit 102 includes a respective data input In, coupling the respective input data signal IDOT_0, IDOT_1, IDOT_2, IDOT_3, IDOT_4, IDOT_5 to a respective first data output On, or when redundancy steering is enable to a respective second data steering output Os, as shown in dotted line in FIG. 2. Each dynamic merged redundancy steering and bit multiplexer circuit 102 includes a respective data steering input Is, receiving the respective redundancy steering data signal IDOT_0, IDOT_1, IDOT_2, IDOT_3, IDOT_4, IDOT__ from the adjacent second data steering output Os coupling the respective redundancy steering data signal to the respective data output On responsive to redundancy steering being enabled as shown in dotted line in FIG. 2. In the dynamic merged redundancy steering and bit multiplexer circuit 102 when redundancy steering is not enabled, the path from Is to Os is blocked and data is passed from input In to output On as shown in dotted line in FIG. 1.

As shown, the prior art SRAM column redundancy steering circuit includes respective data columns 103 receiving the data signals IDOT_0, IDOT_1, and IDOT_2 before the repowering buffers 105 and respective data columns 103 receiving the data signals from the SRAM core IDOT_3, IDOT_4, IDOT_5 after the repowering buffers 105.

As shown in FIG. 2, responsive to redundancy steering being enabled the output net labeled GDOT_3 receives the data signal IDOT_2 from the column 103 before the repowering buffers 105 and receives the precharge signal from the precharge function 104 associated with the column 103 after the repowering buffers 105 as shown in dashed line. With the data comes from the portion of the SRAM core before the wordline repowering and the precharge comes from after the wordline repowering, this poses very difficult timing conditions on this dynamic net GDOT_3 and can cause DC contention at this net. As a result, power is wasted because the data will be trying to pull this net low while the precharge signal is still on.

Figure 3:
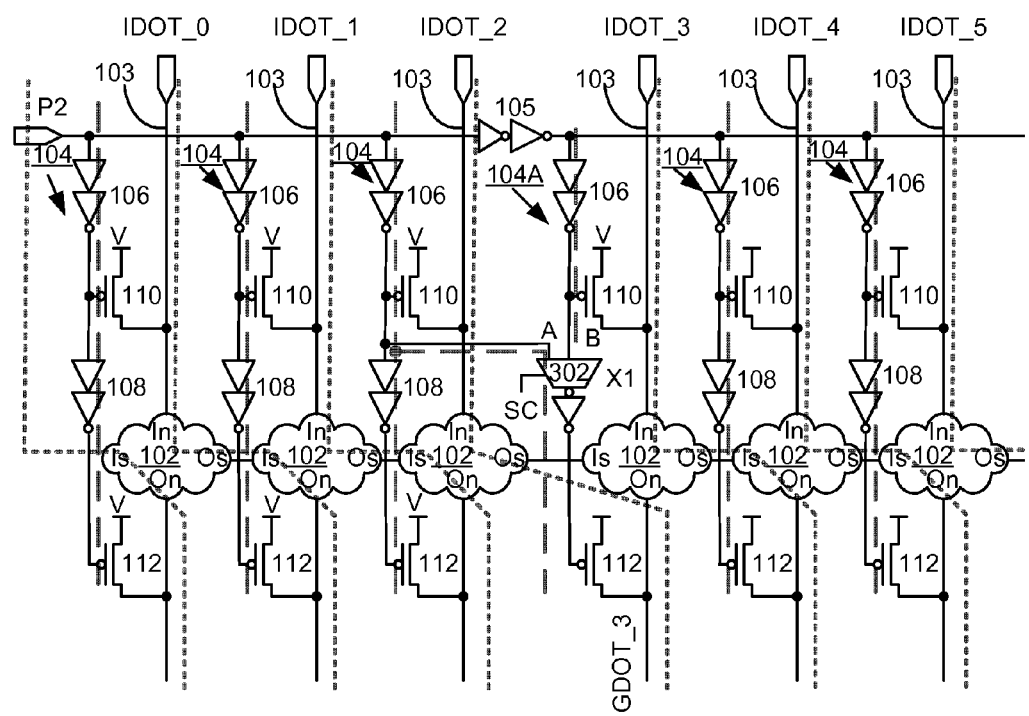
FIG. 3 is a schematic diagram illustrating an example circuit for implementing enhanced column redundancy steering for memories with wordline repowering in accordance with a preferred embodiment.

Having reference now to FIG. 3, there is shown an example circuit for implementing column redundancy steering generally designated by the reference character 300 in accordance with the preferred embodiment. Circuit 300 includes identical or similar functions and components indicated by the same reference characters as used with respect to the prior art SRAM column redundancy steering circuit illustrated in FIGS. 1 and 2.

In accordance with features of the invention, circuit 300 eliminates the difficult timing conditions and contention power problems of the prior art SRAM column redundancy steering circuit illustrated in FIGS. 1 and 2.

Circuit 300 includes the dynamic merged redundancy steering and bit multiplexer circuits 102, a plurality of data signals IDOT_0, IDOT_1, IDOT_2, IDOT_3, IDOT_4, and IDOT_5 from an SRAM core coupled by a respective data column 103 to the respective dynamic merged redundancy steering and bit multiplexer circuits 102. In circuit 300 the respective data columns 103 receive a precharge signal applied by an associated precharge function 104. Circuit 300 includes repowering buffers 105.

Circuit 300 includes respective precharge functions 104 having a first inverter precharge buffer 106 and a second inverter precharge buffer 108, respectively providing a gate input to a respective P-channel field effect transistor (PFET) 110, 112. Each respective P-channel field effect transistor (PFET) 110, 112 of the respective precharge functions 104 is connected between a supply voltage V and the respective adjacent SRAM data column 103 before and after the dynamic merged redundancy steering and bit multiplexer circuit 102 respectively applying a precharge signal to data column 103.

In accordance with features of the invention, circuit 300 includes a precharge function 104A associated with the data column 103 after the repowering buffers 105. In precharge function 104A, an inverting multiplexer 302 is provided in a precharge path after the repowering buffers 105 at a location X1. The inverting multiplexer 302 has a pair of inputs A, B respectively coupled to the precharge function 104 before the repowering buffers 105 and to the precharge function 104A after the repowering buffers 105. The inverting multiplexer 302 replaces the inverter of the second inverter precharge buffer 108 in the other precharge functions 104.

In accordance with features of the invention, the inverting multiplexer 302 steers the precharge signal with the associated data signal being steered from the steered data column 103 before the wordline repowering buffers 105. The inverting multiplexer 302 is controlled by the redundancy steering control signal SC that activates redundancy steering.

In accordance with features of the invention, the inverting multiplexer 302 either passes the precharge signal from the precharge function 104 before the wordline repowering associated with the IDOT_2 data signal or from the precharge function 104A after the repowering buffers 105 associated with the IDOT_3 data signal.

In circuit 300, the inverting multiplexer 302 passes a precharge signal indicated at input A from the precharge function 104 before the wordline repowering responsive to redundancy steering SC being enabled. The inverting multiplexer 302 passes a precharge signal indicated at input B from the precharge function after the wordline repowering responsive to redundancy steering not being enabled.

In circuit 300, there is no longer special considerations or contention power problems associated with the dynamic net GDOT_3. The dynamic net GDOT_3 receives the steered precharge signal from the precharge function 104 before the repowering buffers 105 and the steered IDOT_2 data signal from the data column 103 before the wordline repowering buffers 105 responsive to redundancy steering SC being enabled.

Figure 4:
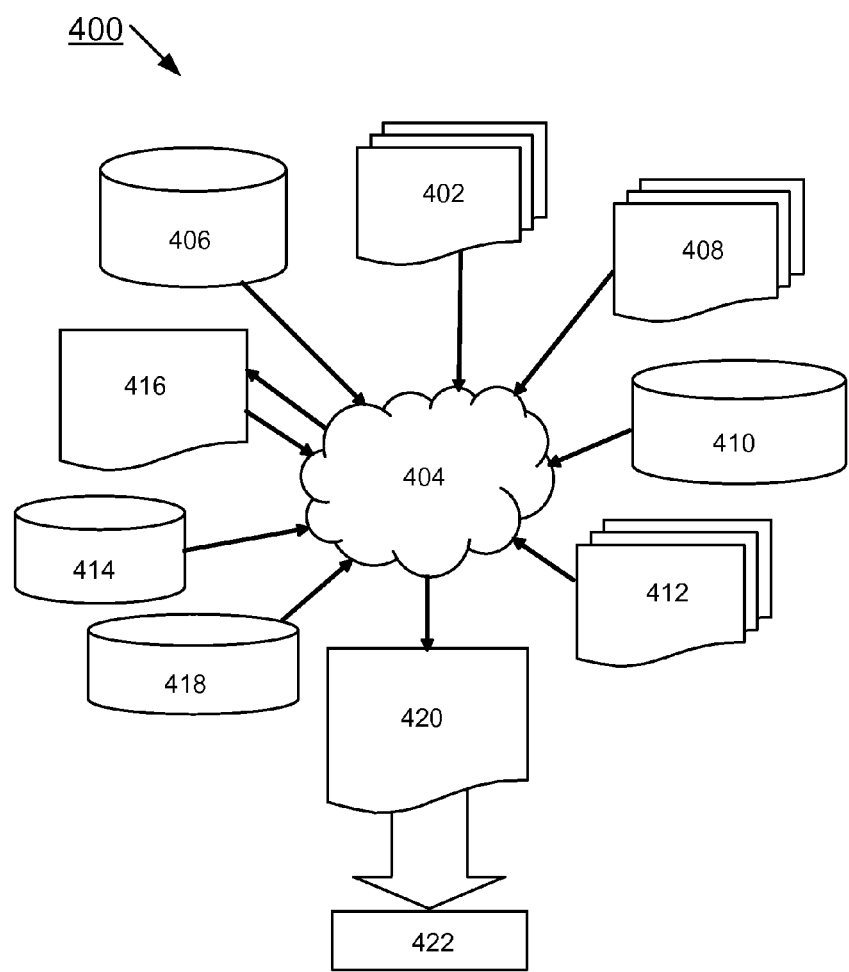
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuit 300 in the form of schematics or HDL, a hardware-description language, for example, Verilog, VHDL, C, and the like. Design structure 402 may be contained on one or more machine readable medium. For example, design structure 402 may be a text file or a graphical representation of circuit 300. Design process 404 preferably synthesizes, or translates, circuit 300 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuits.

Design process 404 may include using a variety of inputs; for example, inputs from library elements 408 which may house a set of commonly used elements, circuits, and devices, including models, layouts, and symbolic representations, for a given manufacturing technology, such as different technology nodes, 32 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIG. 3 along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 3. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing column redundancy steering for memories with wordline repowering comprising:
providing an associated precharge function for applying a precharge signal to a respective data column;
providing an inverting multiplexer in a precharge path after the wordline repowering, said inverting multiplexer having inputs coupled to the respective precharge functions before the wordline repowering and after the wordline repowering;
said inverting multiplexer being controlled by a redundancy steering control signal;
said inverting multiplexer passing a precharge signal from the precharge function before the wordline repowering responsive to redundancy steering being enabled; and
said inverting multiplexer passing a precharge signal from the precharge function after the wordline repowering responsive to redundancy steering not being enabled.

2. The method as recited in claim 1 wherein said inverting multiplexer steers the precharge signal with the data signal being steering from the steered data column before the wordline repowering.

3. The method as recited in claim 1 wherein said redundancy steering control signal controls a dynamic merged redundancy steering and bit multiplexer circuit.

4. The method as recited in claim 3 wherein said dynamic merged redundancy steering and bit multiplexer circuit selects a data signal from a steered data column responsive to said redundancy steering control signal being enabled.

5. The method as recited in claim 3 wherein said wherein said dynamic merged redundancy steering and bit multiplexer circuit blocks a data signal from a steered data column responsive to said redundancy steering control signal not being enabled; and passes a data signal from an input data column.

6. The method as recited in claim 4 wherein said inverting multiplexer is used in the precharge function after the wordline repowering replacing an inverter in the precharge path.

7. A circuit for implementing column redundancy steering for memories with wordline repowering comprising:
a precharge function applying a precharge signal to a respective associated data column;
an inverting multiplexer provided in a precharge path after the wordline repowering having inputs coupled to the respective precharge functions before and after the wordline repowering;
said inverting multiplexer being controlled by a redundancy steering control signal;
said inverting multiplexer passing a precharge signal from the precharge function before the wordline repowering responsive to redundancy steering being enabled; and
said inverting multiplexer passing a precharge signal from the precharge function after the wordline repowering responsive to redundancy steering not being enabled.

8. The circuit as recited in claim 7 wherein said inverting multiplexer steers the precharge signal with the data signal being steering from the data column before the wordline repowering.

9. The circuit as recited in claim 7 includes a dynamic merged redundancy steering and bit multiplexer circuit being controlled by said redundancy steering control signal.

10. The circuit as recited in claim 9 wherein said dynamic merged redundancy steering and bit multiplexer circuit selects a data signal from a steered data column responsive to said redundancy steering control signal being enabled.

11. The circuit as recited in claim 9 wherein said dynamic merged redundancy steering and bit multiplexer circuit blocks a data signal from a steered data column responsive to said redundancy steering control signal not being enabled; and passes a data signal from the input data column.

12. A design structure embodied in a non-transitory machine readable medium used in a design process, the design structure comprising:
a circuit tangibly embodied in the non-transitory machine readable medium used in the design process, said circuit for implementing column redundancy steering for memories with wordline repowering, said circuit comprising:

a precharge function applying a precharge signal to a respective associated data column;

an inverting multiplexer provided in a precharge path after the wordline repowering having inputs coupled to the respective precharge functions before and after the wordline repowering;

said inverting multiplexer being controlled by a redundancy steering control signal;

said inverting multiplexer passing a precharge signal from the precharge function before the wordline repowering responsive to redundancy steering being enabled; and said inverting multiplexer passing a precharge signal from the precharge function after the wordline repowering responsive to redundancy steering not being enabled, when read and used in the manufacture of a semiconductor chip produces a chip comprising said circuit.

13. The design structure of claim 12, wherein the design structure comprises a netlist, which describes said circuit.

14. The design structure of claim 12, wherein the design structure resides on storage medium as a data format used for the exchange of layout data of integrated circuits.

15. The design structure of claim 12, wherein the design structure includes at least one of test data files, characterization data, verification data, or design specifications.

16. The design structure of claim 12, wherein said inverting multiplexer steers the precharge signal with the data signal being steering from the data column before the wordline repowering.

17. The design structure of claim 2, wherein said circuit includes a dynamic merged redundancy steering and bit multiplexer circuit being controlled by said redundancy steering control signal.

18. The design structure of claim 17, wherein said dynamic merged redundancy steering and bit multiplexer circuit selects a data signal from a steered data column responsive to said redundancy steering control signal being enabled.

19. The design structure of claim 17, wherein said dynamic merged redundancy steering and bit multiplexer circuit blocks a data signal from a steered data column responsive to said redundancy steering control signal not being enabled; and passes a data signal from an input data column.

20. The design structure of claim 12, wherein said inverting multiplexer blocking a precharge signal from a steered column precharge signal path before the wordline repowering responsive to redundancy steering not being enabled.

* * * * *